United States Patent [19]
Chung et al.

[11] Patent Number: 5,680,348
[45] Date of Patent: Oct. 21, 1997

[54] POWER SUPPLY INDEPENDENT CURRENT SOURCE FOR FLASH EPROM ERASURE

[75] Inventors: Michael Chung; James Yu, both of San Jose, Calif.

[73] Assignee: Advanced Micro Devices, Inc., Sunnyvale, Calif.

[21] Appl. No.: 566,204

[22] Filed: Dec. 1, 1995

[51] Int. Cl.$^6$ ................................. G11C 11/34
[52] U.S. Cl. .................. 365/185.23; 365/185.33; 365/185.29; 327/538; 327/543
[58] Field of Search ............... 365/185.33, 185.29, 365/185.23, 226, 185.24, 185.3, 185.18, 230.06; 327/538, 540, 541, 543

[56] References Cited

U.S. PATENT DOCUMENTS

| | | | |
|---|---|---|---|
| 5,313,429 | 5/1994 | Chevallier | 365/185.29 |
| 5,365,484 | 11/1994 | Cleveland | 365/185.29 |
| 5,388,069 | 2/1995 | Kokubo | 365/185.18 |
| 5,398,204 | 3/1995 | Maruyama | 365/185.3 |
| 5,414,669 | 5/1995 | Tedrow | 365/185.29 |
| 5,448,190 | 9/1995 | Etoh | 327/543 |
| 5,455,794 | 10/1995 | Javanifard | 365/185.18 |
| 5,491,656 | 2/1996 | Sawada | 365/185.29 |
| 5,514,948 | 5/1996 | Okazaki | 323/314 |
| 5,563,824 | 10/1996 | Miyawaki | 365/185.18 |

FOREIGN PATENT DOCUMENTS

| | | | |
|---|---|---|---|
| 0668593A1 | 8/1995 | European Pat. Off. | G11C 16/06 |

OTHER PUBLICATIONS

Kotowski, Jeffrey P. and Spitzer, Jeffery R., "Precision Integrated Circuit Resistance Mirror," *Motorola Technical Developments Bulletin*, Oct. 1990.

Nakayama, Takeshi et al., "A New Decoding Scheme and Erase Sequence for 5V Only Sector Erasable Flash Memory," *1992 Symposium on VLSI Circuits*, Jun. 4, 1992.

Atsumi, Shigeru et al., "A 16-Mb Flash EEPROM with a New Self-Data-Refresh Scheme for a Sector Erase Operation," IEICE Trans Electron, vol. E77-C, NC, May 5, 1994.

*Primary Examiner*—David C. Nelms
*Assistant Examiner*—Son Mai
*Attorney, Agent, or Firm*—Benman Collins & Sawyer

[57] ABSTRACT

A system and method for providing a constant electric field that is insensitive to fluctuations in the power supply to a FLASH EPROM during erasure. The system comprises a plurality of sector source drivers and a power supply insensitive constant current source. Each sector has at least one binary storage element. Each storage element has a source. The sector source drivers couple the at least one source of a sector to be erased to the power supply insensitive constant current source. The power supply insensitive constant current source provides an electric field across the tunneling oxide which is constant and insensitive to fluctuations in the power supply. This improves the wear characteristics and lifetime of the binary storage elements. In addition, this system remedies problems associated with short channel effects, electron trapping, and the use of various voltage sources.

13 Claims, 3 Drawing Sheets

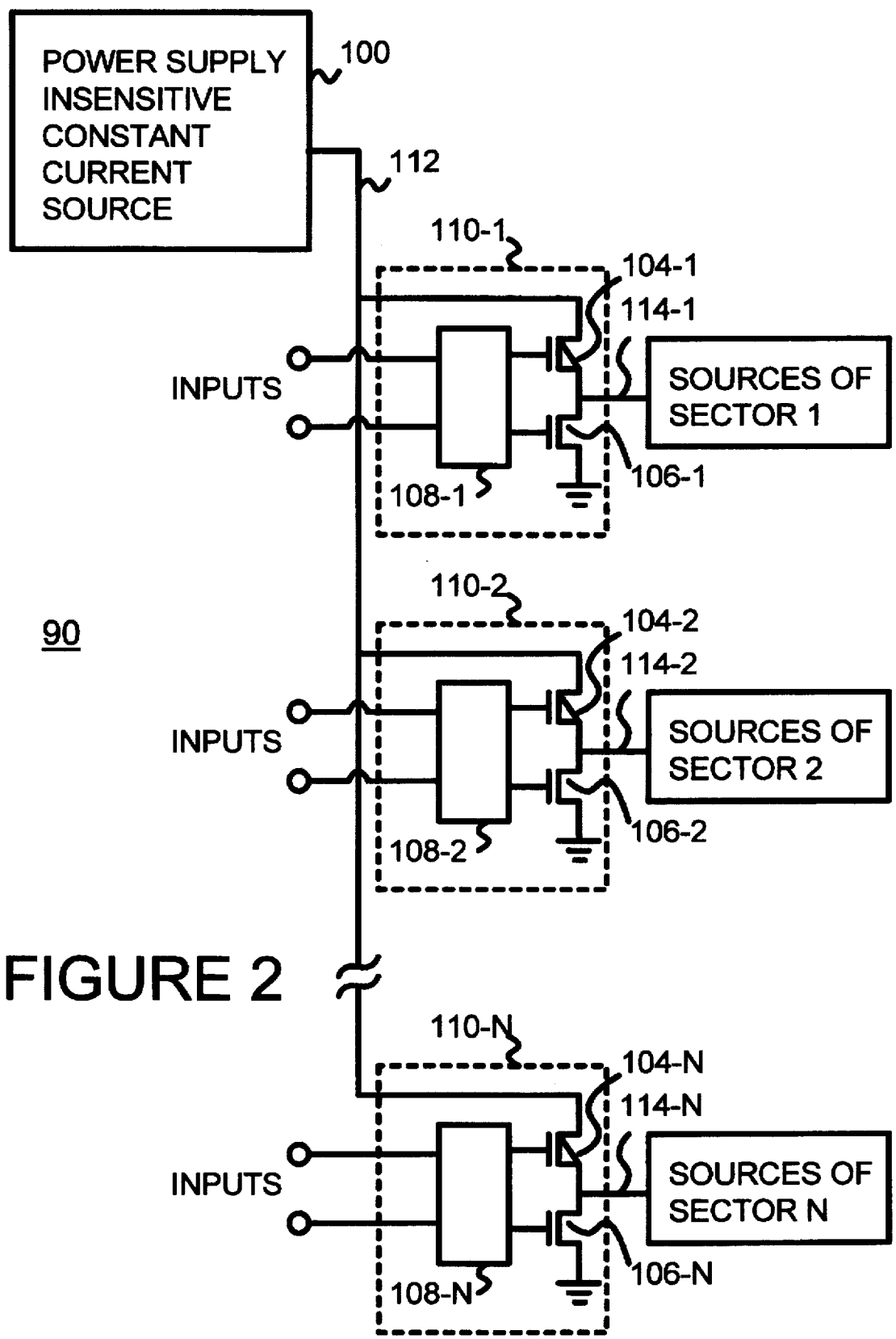

POWER SUPPLY INDEPENDENT CURRENT SOURCE FOR FLASH EPROM ERASURE

FIELD OF THE INVENTION

The present invention relates to FLASH EPROM devices, and more particularly to a method and system for improving the erasure thereof.

BACKGROUND OF THE INVENTION

A typical FLASH EPROM memory chip includes a plurality of binary storage elements. Arrays of storage elements are arranged into sectors. Each sector of the FLASH EPROM can be erased independently of the other sectors. When a sector is erased, all of the storage elements in the sector are erased.

A particular binary storage element is comprised of a source, a drain, and a gate. Typically, a binary storage element is erased by providing a constant voltage to the source of the storage element. During erasure, the electric field that is generated across the tunneling oxide must remain constant to avoid placing undue stress on the tunneling oxide. If a voltage potential is applied directly to the source of the storage element, a very high peak field is generated at the beginning of erasure, placing undue stress on the tunneling oxide. In addition, fluctuations in the power supply of up to ±10% are typical. These fluctuations can also cause fluctuations in the electric field across the tunneling oxide.

Previously, this problem was addressed by placing a resistance between the voltage supply and the source of the storage element. However, the electric field generated is still not constant. In addition, this method does not address the problem of fluctuations in the power supply. This method also fails to address the problem of the large band-to-band tunneling current from the source to the substrate which is generated during erasure.

Other problems with previous methods of erasing a binary storage element are discussed in U.S. patent application Ser. No. 08/440,046 by Tang, et al ("Tang"). Tang describes a method for remedying many of these problems by providing a constant electric field across the tunneling oxide of a binary storage element. In particular, Tang discloses the coupling of current mirror to the source of a binary storage element, thereby providing a constant current to the source. This constant current creates a constant electric field across the tunneling oxide. Although the method of Tang functions well for its intended purpose, it does not address the problem of fluctuations in the power supply.

Accordingly, what is needed is a system and method for providing a constant electric field which is insensitive to fluctuations in the power supply voltage during erasure of a sector of a FLASH EPROM. The present invention addresses such a need.

SUMMARY OF THE INVENTION

The present invention provides a method and system for erasing a sector of a FLASH EPROM memory chip. During erasure, the electric field across the tunneling oxide is constant and independent of fluctuations in the power supply. The system for erasing a particular sector is comprised of a plurality of sector source drivers and a power supply insensitive constant current source. A particular sector source driver selectively couples the sector to be erased to the power supply insensitive constant current source. The constant current source limits the current drawn by the source, thereby limiting the band-to-band tunneling current from the source to the substrate. Thus, the power supply insensitive constant current source ensures that a constant electric field is applied across the tunneling oxide of each storage element in the sector undergoing erasure.

According to the system and method disclosed herein, the present invention erases a sector without subjecting the tunneling oxide and source junction of each storage element to undue stress, thereby increasing the endurance of the storage element. In addition to decreasing wear of the storage elements, the present invention can be used with various power supplies without affecting the characteristics thereof. The present invention also remedies the problem of a large band-to-band tunneling current from the source to the substrate. In addition, the problems of electron trapping in the tunnel oxide, the short channel effect, and a high peak source-to-substrate current, are remedied.

BRIEF DESCRIPTION OF THE DRAWINGS

FIG. 2 is a block diagram of the power supply insensitive circuit for erasing a FLASH EPROM sector in accordance with the present invention.

DESCRIPTION OF THE INVENTION

The present invention relates to erasing a sector of a FLASH EPROM in which the electric field during erasure is constant and insensitive to fluctuations in the power supply. The following description is presented to enable one of ordinary skill in the art to make and use the invention, and is provided in the context of a patent application and its requirements. Various modifications to the preferred embodiment will be readily apparent to those skilled in the art and the genetic principles herein may be applied to other embodiments. Thus, the present invention is not intended to be limited to the embodiment shown but is to be accorded the widest scope consistent with the principles and features described herein.

Figure 1:
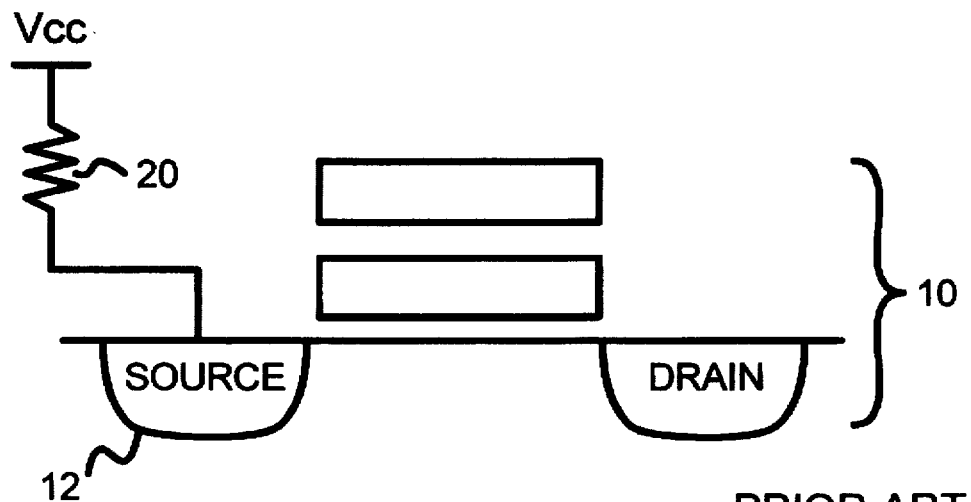
FIG. 1 is a schematic diagram of a conventional circuit for erasing a FLASH EPROM storage element.

FIG. 1 is a schematic diagram of the prior art circuitry for biasing the source of a FLASH EPROM storage element. As shown in FIG. 1, the prior art places resistor 20 between a voltage supply of value $V_{CC}$ and the source 12 of binary storage element 10. In this system, however, the electric field across the tunneling oxide is not constant during erasure. Fluctuations in the power supply are an additional cause of variations in the electric field across the tunneling oxide. Thus, stress is still placed upon the binary storage element. There is also no mechanism present for limiting or controlling the band-to-band tunneling current from the source to the substrate during erasure. In addition, this arrangement does not address the problems of short channel effects, electron trapping, and the use of different voltage supplies.

Figure 1A:
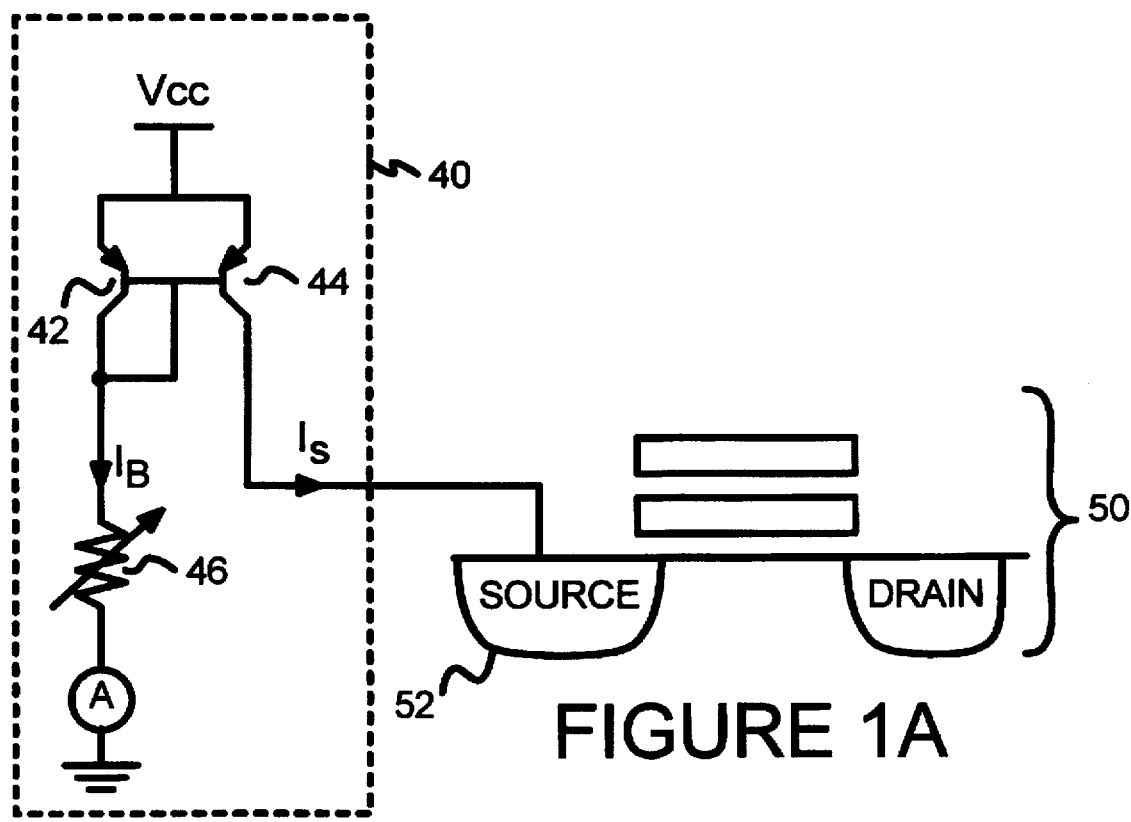
FIG. 1a is a schematic diagram of a system for providing a more stable electric field during erasure of a FLASH EPROM storage element.

FIG. 1a depicts a current for erasing a binary storage element, as disclosed in U.S. patent application Ser. No. 08/440,046. In this embodiment, as long as the band-to-band tunneling current, $I_{BB}$, from the source to the substrate remains constant, the electric field across the tunneling oxide remains constant. The tunneling current, $I_{BB}$, is constant when the current applied to the source of a binary storage element, $I_S$, is constant. Consequently, providing a constant current to the source ensures a constant electric field.

In FIG. 1a, current mirror 40 provides a stable $I_S$ to source 52 of storage element 50. Thus, a relatively constant electric field is generated in the tunneling oxide. This system also solves the problems associated with short channel effects, electron trapping, and high peak source-to-substrate currents.

Although this system works effectively for its stated purpose, it does not address the problem of fluctuations in the electric field due to fluctuations in the power supply. Current mirror 40 is biased by the current, $I_B$, flowing through variable resistor 46. Through Ohm's law, $I_B$ depends on the voltage of the voltage supply. Typically, this voltage fluctuates as much as ±10%. Fluctuations in the voltage supply, therefore, cause variations in $I_B$. Variations in $I_B$ cause variations in $I_S$. Consequently, fluctuations in the power supply cause variations in the electric field across the tunneling oxide.

The present invention provides a system for providing an electric field that is constant and insensitive to fluctuations in the power supply, $V_{CC}$. The present invention will be described in terms of a bias current generator, a current mirror, and source sector select drivers for a FLASH EPROM. However, one of ordinary skill in the art will readily recognize that this method and system will operate effectively using other types of components. Thus, those of ordinary skill in the art will recognize that the generic principles described herein can be used to produce other embodiments.

For the reasons previously discussed, an electric field that is constant and insensitive to fluctuations in the power supply can be ensured by providing a current to the sources of the binary storage elements of a sector which is constant and power supply insensitive.

To more particularly illustrate a system, 90, for selectively providing a constant electric field that is insensitive to power supply fluctuations in accordance with the present invention, refer now to FIG. 2, depicting a block diagram of one embodiment of such a system 90. The block diagram includes a power supply insensitive constant current source 100. Constant current source 100 is selectively coupled to n sectors of the FLASH by sector source drivers 110-l to 110-n. In the preferred embodiment, each sector source driver 110-i is comprised of a sector logic block 108-i and a push-pull device comprised of pull-up device 104-i and push-down device 106-i. In the preferred embodiment, the pull-up device 104-i is a PMOS transistor and the push-down device 106-i is an NMOS transistor. The pull-up devices 104-l to 104-n are coupled in parallel to a common line 112. The push down devices 106-l to 106-n are coupled in parallel to ground. Each push-pull combination is coupled to the sources of the binary storage elements of the corresponding sector by a source node 114-i. Each sector source driver 110-i also has a logic block 108-i for determining whether the pull-up device 104-i or push down device 106-i is to be activated.

When a sector is to be erased, logic block 108-i turns the corresponding pull-up device 104-i "on." Thus, source node 114-i is coupled to the power supply insensitive current source 100 through common line 112. The logic blocks of sectors which are not to be erased turn the corresponding push-down devices "on" and the corresponding pull-up devices "off." Thus, the source nodes of the sectors which are not to be erased are driven to ground, while the source node of a sector undergoing erasure is coupled to power supply insensitive constant current source 100.

Figure 3:
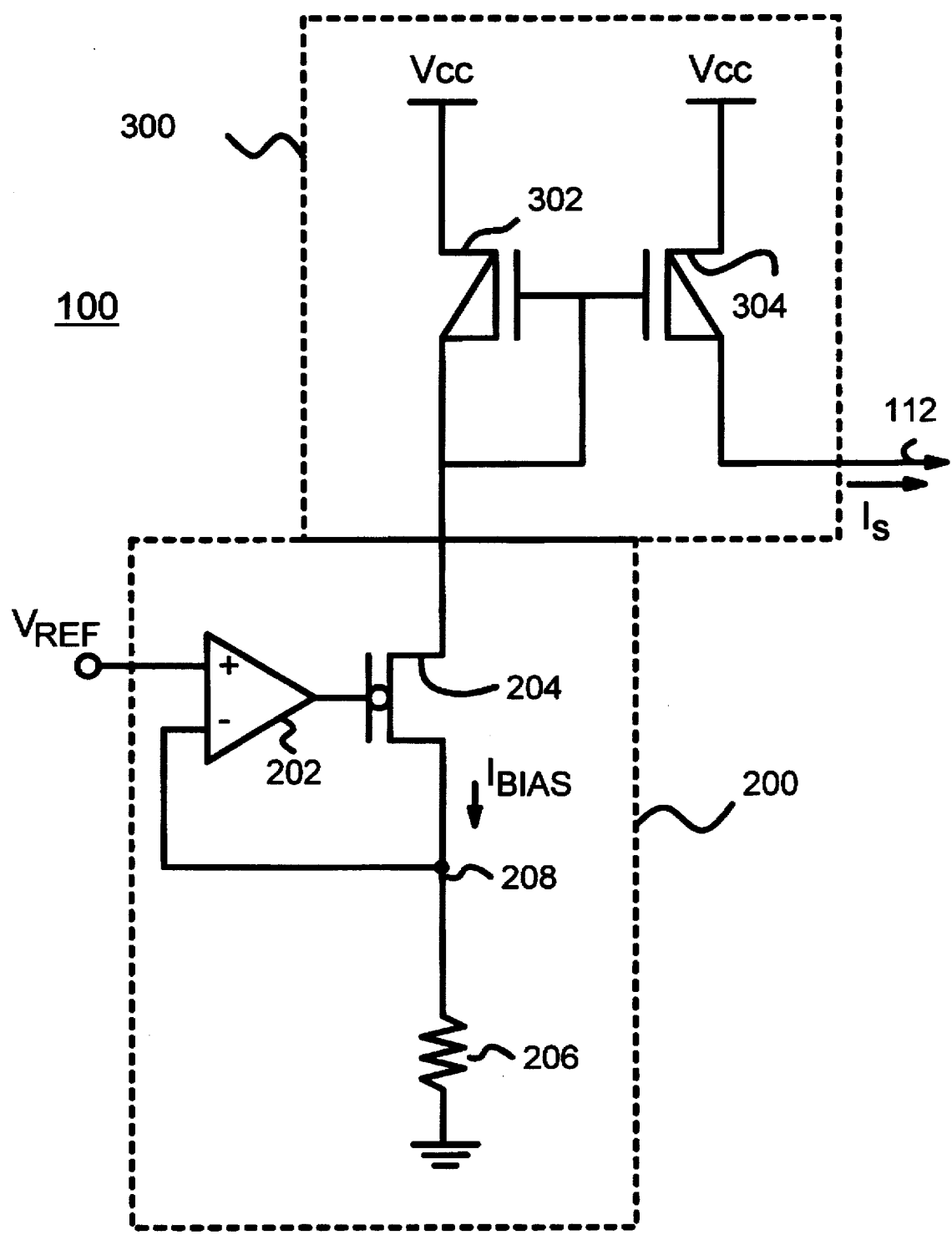
FIG. 3 is a schematic diagram of one embodiment of the power supply insensitive current source in accordance with the present invention.

An embodiment of the power supply insensitive constant current source is shown in greater detail by FIG. 3. The preferred embodiment of the power supply insensitive current source 100 is comprised of bias current generator 200 and current mirror 300. Bias current generator 200 provides a power supply insensitive bias current, $I_{BIAS}$, through resistor 206.

Bias current generator 200 is comprised of differential amplifier 202, NMOS source-follower 204, and resistor 206. Resistor 206 has value R. A power supply insensitive reference voltage $V_{REF}$ is provided to the noninverting input of differential amplifier 202. The means of generating a power supply insensitive reference voltage are understood to those skilled in the art and will not be discussed herein. Differential amplifier 202 and source-follower 204 provide a voltage very nearly equal to $V_{REF}$ at node 208. Because resistor 206 is coupled between node 208 and ground, a bias current $I_{BIAS}=V_{REF}/R$ flows through resistor 206. Thus, bias current $I_{BIAS}$ is also insensitive to fluctuations in the power supply.

In the preferred embodiment, $I_{BIAS}$ serves as the bias current for current mirror 300. Current mirror 300 is comprised of diode coupled PMOS devices 302 and 304. The output of the current mirror is source current $I_S$. Because $I_{BIAS}$ is constant and insensitive to fluctuations in the power supply, $I_S$ is also constant and insensitive to fluctuations in the power supply. Source current $I_S$ is provided to line 112, which, as shown in FIG. 2, is selectively coupled to the sources of a sector which is to be erased. Because a constant, power supply insensitive current $I_S$ is provided to the sources of a sector, the band-to-band tunneling current from the source to the substrate is limited in a constant, predictable fashion. Consequently, the electric fields generated are also constant and insensitive to fluctuations in the power supply.

Those of ordinary skill in the art will recognize that the ratio of the source current $I_S$ to bias current $I_{BIAS}$ depends on the ratio of shape factor of device 302 to the shape factor of device 304. Thus, $I_S/I_{BIAS}=S_{304}/S_{302}$, where $S_j$ is the shape factor of device j.

There are significant advantages to using a power supply insensitive current source for biasing the source sector during erasure. First, because the current source is independent of fluctuations in the power supply, the source current, $I_S$, is limited in a consistent predictable way. The band-to-band tunneling current from the source to the substrate is, therefore, also limited in a controlled, predictable way. Consequently, the electric field across the tunneling oxide is constant and remains unaffected by fluctuations in the power supply. Thus, the tunneling oxide is not subjected to undue stress, improving the endurance of the storage element.

Second, voltage supplies having a variety of values can be used to erase the binary storage elements of a sector. Because the electric field is kept constant by $I_S$, there is no need to ramp up or down the voltage supply being used to provide the erase voltage. In addition, as discussed in application Ser. No. 08/440,046, this invention addresses problems due to the short channel effect, electron trapping in the tunneling oxide, and large ramp steps.

A method and system have been disclosed for providing the sources of a sector with a constant, power supply insensitive current during erasure. This system provides a constant power supply insensitive electric field across the tunneling oxide, improving the endurance, accuracy and reliability of the FLASH EPROM.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for providing a constant electric field that is insensitive to fluctuations in a power supply to a FLASH EPROM during erasure, the FLASH EPROM including a plurality of sectors, each sector having at least one binary storage element therein, each binary storage element having a source, comprising:

a power supply insensitive constant current source for providing a constant power supply insensitive current to the at least one source of a particular sector undergoing erasure, thereby creating a constant electric field that is insensitive to fluctuations in the power supply; and a plurality of sector source drivers for selectively coupling the power supply insensitive constant current source to the at least one source of the particular sector undergoing erasure.

2. The system of claim 1 wherein the power supply insensitive constant current source further comprises:

a bias current generator, for providing a constant power supply insensitive bias current; and a current mirror coupled to the bias current generator, the current mirror having the constant power supply insensitive bias current as an input.

3. The system of claim 2 wherein the constant power supply insensitive current is a multiple of the constant power supply insensitive bias current.

4. The system of claim 2 wherein the bias current generator further comprises a differential amplifier, the differential amplifier having a power supply insensitive reference voltage as an input; and a source-follower device.

5. The system of claim 1 wherein each of the plurality of sector source drivers further comprises:

a logic circuit for determining whether the at least one source of the corresponding sector are to be coupled to the power supply insensitive constant current source; and a push-pull combination coupled to the logic circuit, the push-pull combination for selectively coupling the at least one source of the corresponding sector to the power supply insensitive constant current source in response to a signal from the logic circuit, the push-pull combination having a pull-up device and a push-down device.

6. The system of claim 5 wherein the logic circuit of a sector source driver corresponding to a particular sector undergoing erasure turns the coupled pull-up device "on," thereby coupling the sector undergoing erasure to the power supply insensitive constant current source; and a logic circuit of a sector source driver corresponding to a particular sector not undergoing erasure turns the coupled push-down device "on" and the coupled pull-up device "off," thereby coupling the sector not undergoing erasure to ground.

7. A method of providing a constant electric field that is insensitive to fluctuations in the power supply to a FLASH EPROM during erasure, the FLASH EPROM including a plurality of sectors, each sector having at least one binary storage element, each binary storage element having a source, comprising the steps of:

providing a constant power supply insensitive current;

selectively coupling the constant power supply insensitive current to the at least one source of a sector undergoing erasure, thereby creating a constant electric field that is insensitive to fluctuations in the power supply.

8. The method of claim 7 further comprising the step of providing a constant power supply insensitive bias current to a current mirror, thereby creating the constant power supply insensitive current.

9. The method of claim 8 wherein the constant power supply insensitive current is a multiple of the constant power supply insensitive bias current.

10. The method of claim 8 further comprising the step of providing a power supply insensitive reference voltage to a differential amplifier coupled to a source follower, thereby providing the power supply insensitive bias current.

11. The method of claim 7 further comprising the steps of:

determining whether each of the plurality of sectors is to undergo erasure;

turning a pull-up device coupled to a particular sector undergoing erasure "on," thereby selectively coupling the constant power supply insensitive current to the at least one source of the sector undergoing erasure;

turning a push-down device coupled to a particular sector not undergoing erasure "on," thereby coupling the sector not undergoing erasure to ground.

12. A system for providing a constant electric field that is insensitive to fluctuations in a power supply to a FLASH EMPROM during erasure, the FLASH EPROM including a plurality of sectors, each sector having at least one binary storage element therein, each binary storage element having a source, comprising:

a power supply insensitive constant current source for providing a constant power supply insensitive current to the at least one source of a particular sector undergoing erasure, thereby creating a constant electric field that is insensitive to fluctuations in the power supply wherein the power supply insensitive constant current source further comprises:

a bias current generator, for providing a constant power supply insensitive bias current;

a current mirror coupled to the bias current generator, the current mirror having the constant power supply insensitive bias current as an input; and a plurality of sector source drivers for selectively coupling the power supply insensitive constant current source to the at least one source of the particular sector undergoing erasure.

13. A method of providing a constant electric field that is insensitive to fluctuations in the power supply to a FLASH EPROM during erasure, the FLASH EPROM including a plurality of sectors, each sector having at least one binary storage element, each binary storage element having a source, comprising the steps of:

providing a constant power supply insensitive current, wherein the constant power supply insensitive current is created by providing a constant power supply insensitive bias current to a current mirror; and selectively coupling the constant power supply insensitive current to the at least one source of a sector undergoing erasure, thereby creating a constant electric field that is insensitive to fluctuations in the power supply.

* * * * *